United States Patent [19]

Mase et al.

[11] Patent Number: 4,634,496

[45] Date of Patent: Jan. 6, 1987

[54] METHOD FOR PLANARIZING THE SURFACE OF AN INTERLAYER INSULATING FILM IN A SEMICONDUCTOR DEVICE

[75] Inventors: Yasukazu Mase, Tokyo; Masahiro Abe, Yokohama; Masaharu Aoyama, Fujisawa, all of Japan

[73] Assignee: Kabushiki Kaisha Toshiba, Kawasaki, Japan

[21] Appl. No.: 797,986

[22] Filed: Nov. 14, 1985

[30] Foreign Application Priority Data

Nov. 15, 1984 [JP] Japan ................... 59-239560

[51] Int. Cl.[4] .................. B44C 1/22; C03C 15/00; C03C 25/06; B29C 17/08
[52] U.S. Cl. ..................... 156/643; 29/591; 156/646; 156/653; 156/657; 156/659.1; 156/668; 204/192.32; 357/71; 427/38; 427/88; 427/93
[58] Field of Search ............... 156/643, 646, 653, 657, 156/659.1, 661.1, 662, 668; 204/192 EC, 192 E; 427/38, 39, 88, 93-95; 430/313, 317; 357/65, 71; 29/580, 591

[56] References Cited

U.S. PATENT DOCUMENTS

| | | | |
|---|---|---|---|
| 4,478,679 | 10/1984 | Chang et al. | 156/657 X |
| 4,511,430 | 4/1985 | Chen et al. | 156/657 X |
| 4,523,975 | 6/1985 | Groves et al. | 156/657 X |
| 4,545,852 | 10/1985 | Barton | 156/657 X |

OTHER PUBLICATIONS

Adams et al., "Planarization of Phosphorus-Doped Silicon Dioxide", J. Electrochem. Soc.: Solid-State Science and Technology, vol. 128, No. 2.
M. Inoue et al., "Smooting Technique by Etching Back," Semiconductor World, Oct. 1984.

Primary Examiner—William A. Powell
Attorney, Agent, or Firm—Finnegan, Henderson, Farabow, Garrett & Dunner

[57] ABSTRACT

A method for planarizing the surface of an insulation layer deposited on a first interconnection layer to allow a second interconnection layer deposited thereon without causing a breakage of the second interconnection layer. This method is characterized in that at least two insulation films, different in etching characteristics each other, are first formed on the first interconnection layer, and then a resist layer is deposited on the second insulating film. Subsequently, a portion of the resist layer is etched to expose the top surface of the second insulating film, and the second insulating film is selectively and anisotropically etched using the remaining resist layer as a mask. After removing the first insulating film and the remaining resist mark, a third insulating film is deposited to a thickness sufficient to make flat the surface thereof.

5 Claims, 14 Drawing Figures

METHOD FOR PLANARIZING THE SURFACE OF AN INTERLAYER INSULATING FILM IN A SEMICONDUCTOR DEVICE

BACKGROUND OF THE INVENTION (a) Field of the Invention

This invention relates to a method for planarizing the surface of an interlayer insulating film in a process for forming a multi-layered interconnection layer of a semiconductor device.

(b) Description of the Prior Art

In order to prevent a possible breakage of interconnection layers, or a possible short-circuiting between the interconnection layers, in a high-integration semiconductor device of a multi-layered interconnection structure it is necessary to form the surface of the interlayer insulating film as flat as possible. Various methods have been developed to planarize the surface of such an interlayer insulating film. Of these conventional methods, an etch-back method is known as a relatively simpler, useful method.

FIGS. 1(A) to 1(E) are cross-sectional views showing main steps of the known etch-back method. In this method, as shown in FIG. 1(A), an $Si_3N_4$ film 2 is formed as an underlying insulating film on a thermal oxide film 1, by virtue of a lower-pressure CVD method, which overlies the silicon semiconductor substrate 10; a first interconnection layer 3 of an Al-Si alloy is formed on the $Si_3N_4$ film 2; a plasma nitride silicon film 4 (hereinafter referred to as a P-SiN film) is deposited on the resultant structure by virtue of a plasma CVD method; and a positive type resist film 5 is formed on the resultant structure. When the respective film has a thickness of 1 $\mu$m, then the P-SiN film 4 and resist film 5 are usually made to be 1 $\mu$m and 2 $\mu$m, respectively, in thickness.

Then, the resist film 5 and P-SiN film 4 are etched at the same etching rate, and that area "A" (See FIG. 1(A)) of the P-SiN film 4, which is located above the top surface and shoulds of the first interconnection layer 3, has its upper half area removed as shown in FIG. 1(B). In this case, a reactive ion etching (hereinafter referred as an RIE) is used as the etching method. The P-SiN film 4 is further etched by the RIE etching method and then stopped to leave a 0.3 $\mu$m-thick area between the top surface of the first interconnection layer 3 and the surface of the P-SiN film 4 as shown in FIG. 1(C). At this time, a damaged area 4a is formed at the surface of the P-SiN film 4 due to the use of the RIE method and the area "A" of the P-SiN film 4 is completely removed.

The damaged area 4a provides a cause for leakage and, if removed by a chemical dry etching (hereinafter referred to a CDE) method, will be as shown in FIG. 1(D). Finally, an additional 1 $\mu$-thick P-SiN film 6 is deposited by the plasma CVD method on the P-SiN film 4 as shown in FIG. 1(E), providing a flat interlayer insulating film.

However, the known etch-back method involves the following problems (1) to (4):

(1) The known etch-back method utilizes the CDE method when the damaged layer 4a—See FIG. 1(C)—resulting from the use of the RIE method is eliminated. Since in this case the P-SiN film portion in contact with the interconnection metal, i.e., that P-SiN film portion "B"—See FIG. 1(A)—situated near the side of the first interconnection layer 3 is liable to be etched due to, for example, a structural strain occurring at that portion, the P-SiN film portion "B" at the side of the first interconnection layer 3 is etched earlier than the rest of the P-SiN film 4 at the time of etching the damaged layer 4a. As a result, the P-SiN film portion at the side of the first interconnection layer 3 is deeply etched, resulting in exposing the side surface of the first interconnection layer 3, for example, in FIG. 2(A) and, in the worst case, in causing an etching down to the $Si_3N_4$ film 2, as shown in FIG. 2(B), underlying the P-SiN film 4.

(2) In order to prevent such an occurrence as shown in FIGS. 2(A) and 2(B), it is necessary that an about 0.3 $\mu$m-thick P-SiN film portion be left, as shown in FIG. 1(C), between the top surface of the first interconnection layer 3 and the upper surface of the P-SiN film 4. However, the thickness of the P-SiN film 4 at the deposition time varies from lot to lot of the semiconductor substrate and a varying thickness is also observed in the respective lots. It is, therefore, impossible to detect a point of time at which an accurate etching is ended, failing to positively leave a 0.3 $\mu$m-thick P-SiN film portion (a desired thickness), as shown in FIG. 1(C), between the upper surface of the first interconnection layer 3 and the upper surface of the P-SiN film 4. Conventionally, the etching requirements for a succeeding lot are set, taking the etching data of test pieces in a preceding lot into consideration. Thus, an operation error is liable to occur.

(3) In the RIE method, an overetching step cannot be carried out to eliminate a variation in etching depth from substrate to substrate, a variation in etching depth from lot to lot of the semiconductor substrates and a variation in etching depth of a single semiconductor substrate. Since the thickness of the P-SiN film area left between the upper surface of the first interconnection layer 3 and the upper surface of the P-SiN film varies, there is a variation in the through-hole etching time, the threshold voltage of a field area and the capacitance of a capacitor due to the presence of the interlayer insulating film and a consequent variation in the quality of semiconductor devices.

(4) In the steps as shown in FIGS. (A) and (B), the inorganic P-SiN film 4 and organic resist film 5 needs to be etched at the same etching rate. In this case, the operation and control of the RIE device needs to be performed under strict requirements when both the films differing in their etching property are etched at the same etching rate. Furthermore, a frequent checkup is required to see that the above-mentioned requirements are met. The RIE device is complex to manage and thus it is not easy to operate the RIE device.

SUMMARY OF THE INVENTION

An object of this invention is to provide an interlayer insulating film planarizing method which provides a better solution to problems encountered in a conventional etch-back method.

Another object of this invention is to provide a method for planarizing an interlayer insulating film easily and securely to reduce a variation in the quality of semiconductor devices.

According to this invention there is provided a method for planarizing an interlayer insulating film, comprising the steps of:

(a) forming a first interconnection layer on an underlying insulating film such that the film overlies a semiconductor substrate;

(b) depositing a first insulating film of a predetermined thickness on the resultant structure to cover at least the first interconnection layer;

(c) depositing a second insulating film on the first insulating film differing in etching properties from the second insulating film;

(d) depositing a resist layer on the second insulating film;

(e) removing the resist layer by an etching step to expose a top surface of the second insulating film and forming a resist mask covering a portion of the second insulating film which is located between said first interconnection layer and an adjacent first interconnection layer;

(f) effecting such an anisotropic etching as to permit the second insulating film to be selectively etched with the first insulating film as an etching stopper, while leaving only that portion of the second insulating film which is located beneath the resist mask;

(g) removing the first insulating film and resist mask to expose the underlying insulating film, first interconnection layer and second insulating film portion; and (h) depositing a third insulating film on the resultant structure to a depth at which the surface of the third insulating film becomes flat.

As the first insulating film acting as an etching stopper use may be made of a silicon oxide film which is formed by, for example, the plasma CVD method. A silicon nitride film can be formed by, for example, a plasma CVD method as the second insulating film which is faster in etching rate than the first insulating film under the etching step adopted.

The combination between the etching stopper formation film (the first insulating film) and a readily etched film (the second insulating film) as set out above may be properly selected. For example, as the first insulating film use may be made of polyimide, SiC, $Al_2O_3$ etc. and as the second insulating film use may be made of a PSG film etc. which are formed by virtue of the CVD method.

The etching of the resist layer can be effected employing the RIE ashing method using an oxygen gas, method using an etchant, and so on. A dry etching, wet etching, etc. can be properly used for etching the first and second insulating films.

According to this invention it is possible to obtain the following advantages:

(a) The second insulating film can be overetched with the first insulating film as the etching stopper, taking into consideration a variation in thickness from lot to lot when the interlayer insulating film is formed, as well as a variation in etching depth from wafer to wafer and from lot to lot at the RIE time. Since there is no variation in etching depth, it is not necessary to effect a re-etching step or an additional etching step. It is, therefore, possible to stably etch back the insulating film.

(b) It is not necessary to modify the etch-back requirements for a succeeding lot, taking into consideration the etching data of a proceeding lot on the basis of test pieces. It is possible to perform a ready etchback operation and to prevent a possible operation error.

(c) Since it is not necessary to leave the interlayer insulating film as in the conventional method when the insulating film on the first interconnection layer is removed, it is possible to better control the etching process and it is easier to operate the RIE device. There occurs no variation in through-hole etching time resulting from a variation in the thickness of the insulating film on the first interconnection layer.

(d) The field area is formed such that the portions of the first and second insulating films are so left at the field area as to eventually have a predetermined thickness. For this reason, there is no possibility that the thickness of the field area will be affected, as encountered in the prior art, due to a variation in etching depth. The threshold voltage on the field area, capacitance of a capacitor due to the presence of the interlayer insulating film, and so on vary only to a lesser extent than those in the conventional semiconductor device. Furthermore, an etching step is effected at a high selection ratio between the resist and the insulating film with the field area as a mask. Therefore, no pinhole etching occurs readily at the field area due to pinholes, voids and so on of the resist when compared with the conventional method.

(e) There is no risk that the insulating film underlying the first interconnection layer will be etched.

(f) It is not necessary to etch the resist and insulating film simultaneously at the same etching rate. Thus, no frequent checkup and confirmation are necessary with respect to the RIE device and the method of this invention assures a ready operation.

DETAILED DESCRIPTION OF THE PREFERRED EMBODIMENTS

One embodiment of this invention will be explained below by referring to FIGS. 3(A) to 3(G).

Figure 1A:
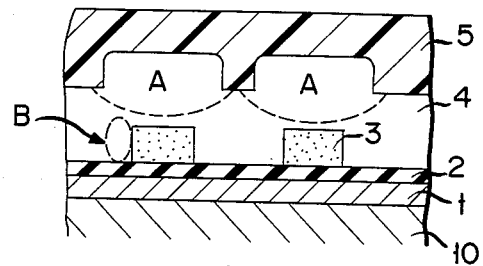
FIGS. 1(A) to 1(E) shows the steps of a method for forming an interlayer insulating film by virtue of a conventional etch-back method.
Figure 1B:
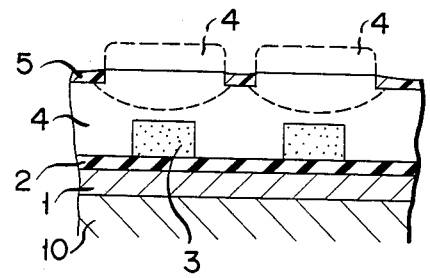
Figure 1C:
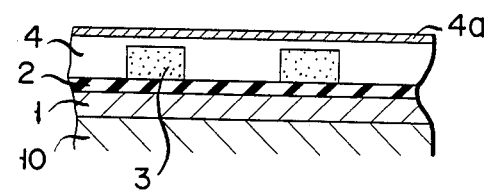
Figure 1D:
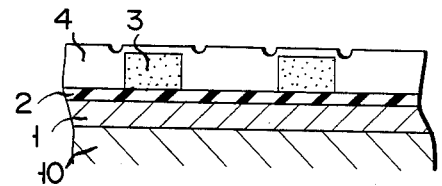
Figure 1E:
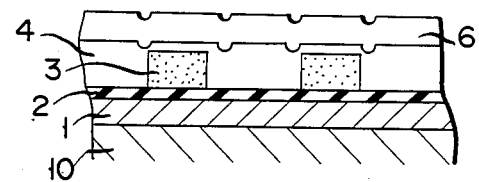
Figure 2A:
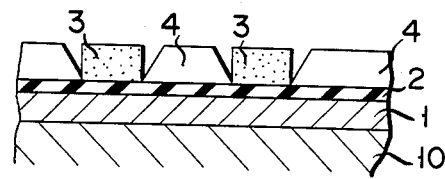
FIGS. 2(A) and 2(B) are cross-sectional views for explaining the drawbacks of the conventional method.
Figure 2B:
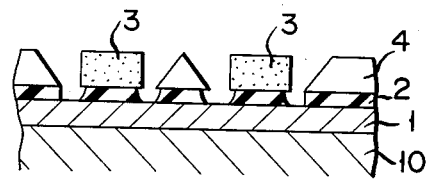
Figure 3A:
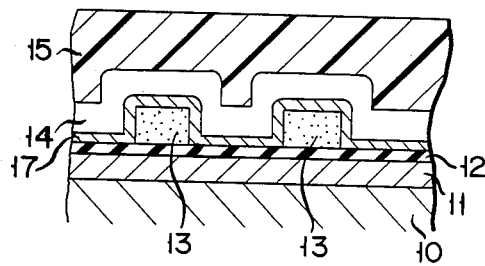
FIGS. 3(A) to 3(G) are cross-sectional views showing a method for planarizing an interlayer insulating film according to this invention.

As shown in FIG. 3(A), a 0.5 $\mu$m-thick thermal oxide film 11 is formed on the surface of a semiconductor substrate 10; a 0.5 $\mu$m-thick $Si_3N_4$ film 12 is formed as an underlying insulating film on the surface of the resultant structure by virtue of a low-pressure CVD method; and a first interconnection layer 13 of, for example, aluminum or an Al-Si alloy is formed on the surface of the resultant structure to have a thickness of 1 $\mu$m. Then, a plasma silicon oxide film (hereinafter referred to as a P-SiO$_2$ film) 17 of, for example, 0.2 $\mu$m in thickness is deposited as a first insulating film on the resultant structure by virtue of the plasma CVD method under the following conditions:

(1) An $SiH_3/NO_2$ flow rate of 50/1500 scc M;
(2) A carrier gas (Ar) flow rate of 500 scc M:
(3) A pressure level of 100 Pa;
(4) A temperature of 330° C.; and
(5) An RF output of 200 W.

Then, a P-SiN film 14 of, for example, 0.8 $\mu$m in thickness is deposited as a second insulating film on the surface of the resultant structure by virtue of the plasma CVD method under the following conditions:

(1) An $SiH_4/NH_3$ flow rate of 60/300 scc M;
(2) A carrier gas (Ar) of 700 scc M;
(3) A pressure level of 87 Pa;

(4) A temperature of 330° C.; and
(5) An RF output of 320 W.

Figure 3B:
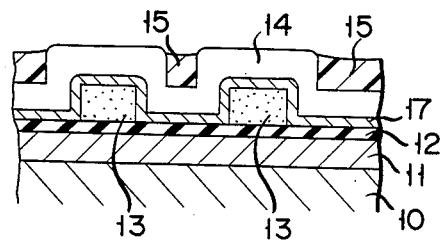
Figure 3C:
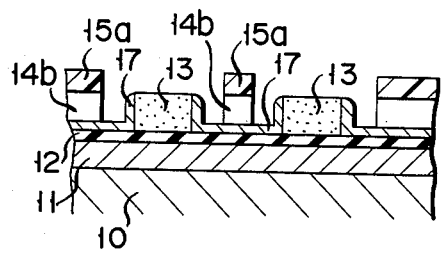

Then, a positive type resist film 15 of, for example, 2.5 μm in thickness is formed on the surface of the P-SiN film 14. The resist film is etched by the RIE method in an $O_2$ atmosphere at an $O_2$ gas flow rate of 60 sccM, pressure level of 2.3 Pa and RF output of 520 W to expose the top surface of the P-SiN film portion (14), as shown in FIG. 3(B), situated above the top surface and shoulders of the first interconnection layer 13. Then, the P-SiN film portion (14) situated above the top surface and shoulders of the first interconnection layer 13 is etched by the RIE method, as shown in FIG. 3(C), with the $P-SiO_2$ film 17 as an etching stopper, while meeting the following conditions:

(1) An $SF_6$, gas flow rate of 80 sccM;
(2) A pressure level of 10 Pa;
(3) An RF output of 450 W; and
(4) A $P-SiN/P-SiO_2$ selection ratio of 4/1.

In this step, i.e., the step for removing the P-SiN film 14 around the first interconnection layer 13, with a remaining portion 15a of the resist film as a mask an etching step is carried out with such a selective etching ratio as to permit the P-SiN film 14 to be etched, for example, at a speed four-times as fast as that of the $P-SiO_2$ film 17, noting that the portion 15a is left at the preceding etching step. At the end of the etching step, the $P-SiO_2$ film 17 overlying the surface of the first interconnection layer 13 is left, but the P-SiN film 14 overlying $P-SiO_2$ film 17 is removed except for a portion 14b situated beneath the portion 15a.

Figure 3D:
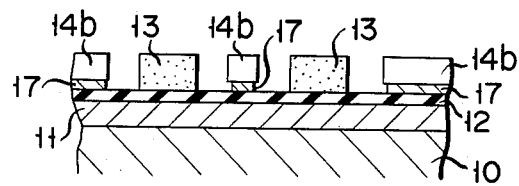

Then, the remaining $P-SiO_2$ film 17 is removed by, for example, a wet etching step using an etching solution $NH_4F$ and etching temperature of 30° C., and the remaining resist portion 15a is removed by an ashing step at an $O_2$ gas flow rate of 60 sccM, pressure level of 2.3 Pa and RF output of 520 W to obtain a state as shown in FIG. 3D.

Figure 3E:
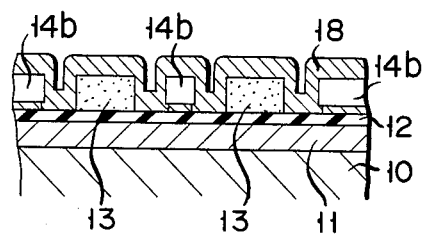
Figure 3F:
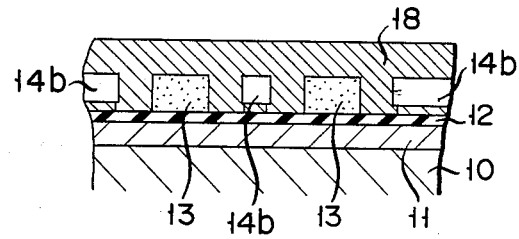

Then, a $P-SiO_2$ film 18 is deposited by the plasma CVD method on the resultant structure, including the exposed first interconnection layer 13 and portion 14b, as shown in FIGS. 3(E) and 3(F), so as to permit the surface of the $SiO_2$ film 18 to be situated at a level adequately higher than that of the top surface of the first interconnection layer 13. By so doing, a groove or valley of 1 μm in width × 1 μm in depth defined at each side of the first interconnection layer is completely filled with the $P-SiO_2$ film 18, thus obtaining an interlayer insulating film whose surface is planarized.

Figure 3G:
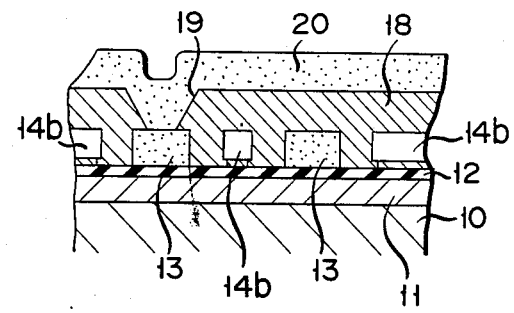

Then, the interlayer film 18 is etched in proper places by virtue of the RIE method to provide a tapered through-hole 19 as shown in FIG. 3(G) with the portion of the first interconnection layer 13 exposed, and a second interconnection layer 20 of, for example, aluminum or an A±-Si alloy is formed by a CVD method on the resultant structure, thus providing a multilayered interconnection structure.

What is claimed is:

1. A method for planarizing a layer-to-layer insulating film, comprising the steps of:
   (a) forming a first interconnection layer on an underlying insulating film such that the film overlies a semiconductor substrate;
   (b) depositing a first insulating film of a predetermined thickness on the resultant structure to cover at least the first interconnection layer;
   (c) depositing a second insulating film on the first insulating film differing in etching properties from the second insulating film;
   (d) depositing a resist layer on the second insulating film;
   (e) removing the resist layer by an etching step to expose a top surface of the second insulating film and forming a resist mask covering a portion of the second insulating film which is located between said first interconnection layer and an adjacent first interconnection layer;
   (f) effecting such an anisotropic etching as to permit the second insulating film to be selectively etched with the first insulating film as an etching stopper, while leaving only that portion of the second insulating film which is located beneath the resist mask;
   (g) removing the first insulating film and resist mask to expose the underlying insulating film, first interconnection layer and second insulating film portion; and
   (h) depositing a third insulating film on the resultant structure to a depth at which the surface of the third insulating film becomes flat.

2. The method according to claim 1, in which said step (c) permits the second insulating film to be formed with a valley left between said first interconnection layer and the adjacent first interconnection layer and said step (e) etches away said resist layer to leave the resist mask only in the valley.

3. The method according to claim 1, in which said first insulating film is a silicon oxide film and said second insulating film is a silicon nitride film.

4. The method according to claim 1, in which said first insulating film is one kind selected from the group consisting of polyimide, SiC and $Al_2O_3$ and said second insulating film is a silicon nitride film.

5. The method according to claim 1, in which said anisotropic etching in said step (f) is an RIE method.

* * * * *